US008895235B2

(12) United States Patent
Ueno et al.

(10) Patent No.: US 8,895,235 B2
(45) Date of Patent: Nov. 25, 2014

(54) PROCESS FOR PRODUCTION OF PHOTORESIST PATTERN

(75) Inventors: Kosei Ueno, Hokkaido (JP); Hiroaki Misawa, Hokkaido (JP)

(73) Assignee: National University Corporation Hokkaido University, Sapporo-Shi, Hokkaido (JP)

( * ) Notice: Subject to any disclaimer, the term of this patent is extended or adjusted under 35 U.S.C. 154(b) by 102 days.

(21) Appl. No.: 13/582,336

(22) PCT Filed: Mar. 1, 2011

(86) PCT No.: PCT/JP2011/001192
§ 371 (c)(1),
(2), (4) Date: Sep. 25, 2012

(87) PCT Pub. No.: WO2011/108259
PCT Pub. Date: Sep. 9, 2011

(65) Prior Publication Data
US 2013/0017499 A1 Jan. 17, 2013

(30) Foreign Application Priority Data
Mar. 2, 2010 (JP) ................................ 2010-045503

(51) Int. Cl.
*G03F 7/20* (2006.01)
*H01L 21/027* (2006.01)
*G03F 1/50* (2012.01)

(52) U.S. Cl.
CPC .......... *H01L 21/0274* (2013.01); *G03F 7/7035* (2013.01); *G03F 7/70375* (2013.01); *G03F 7/70408* (2013.01); *G03F 1/50* (2013.01); *G03F 7/2014* (2013.01)
USPC .......................................... 430/396; 430/322

(58) Field of Classification Search
CPC .............. G03F 7/70375; G03F 7/7035; H01L 21/0274
USPC ................................................. 430/322, 396
See application file for complete search history.

(56) References Cited

U.S. PATENT DOCUMENTS

| 5,928,815 | A | 7/1999 | Martin |
| 6,236,033 | B1* | 5/2001 | Ebbesen et al. ............... 250/216 |
| 2007/0159617 | A1 | 7/2007 | Mackey |
| 2009/0087793 | A1 | 4/2009 | Kim et al. |

FOREIGN PATENT DOCUMENTS

| CN | 101371193 A | 2/2009 |
| CN | 101403854 A | 4/2009 |
| EP | 1398656 A1 | 3/2004 |
| JP | 2001-284245 A | 10/2001 |
| JP | 2005-260178 A | 9/2005 |
| JP | 2005-303197 A | 10/2005 |
| JP | 2009-11965 A | 1/2009 |
| JP | 2009-87519 A | 4/2009 |
| JP | 2009-523322 A | 6/2009 |
| WO | 2006/092963 A1 | 9/2006 |
| WO | 2006/098446 A1 | 9/2006 |

OTHER PUBLICATIONS

Lim, Y., et al., "Interference of Surface Plasmon Waves and Plasmon Coupled Waveguide Modes for the Patterning of Thin Film", IEEE Journal of Quantum Electronics, vol. 44. No. 4, pp. 305-311, (Apr. 2008), XP011204884.
European Search Report in the Counterpart Application No. 11750372.2, dated Dec. 17, 2013, seven (7) pages.
Luo Xiangang, et al., "Sub-100-nm Photolithography Based on Plasmon Resonance," 2004, Japanese Journal of Applied Physics, pp. 4017-4021, vol. No. 43, No. 6B, The Japan Society of Applied Physics.
Ueno, Kosei, et al., "Nanoparticle-Enhanced Photopolymerization," 2009, J. Phys. Chem., pp. 11720-11724, vol. No. 113, American Chemical Society.
Murazawa, Naoki, et al., "Spatially Selective Nonlinear Photopolymerization Induced by the Near-Field of Surface Plasmons Localized on Rectangular Gold Nanorods," 2009, The Journal of Physical Chemistry Letters, pp. 1147-1149, vol. No. 113, American Chemical Society.

* cited by examiner

Primary Examiner — Kathleen Duda
(74) Attorney, Agent, or Firm — Nath, Goldberg & Meyer; Jerald L. Meyer; Leonid D. Thenor (57) ABSTRACT

Disclosed is a process for producing a photoresist pattern, comprising the steps of: preparing a photomask that comprises a metal nano structure having a metal film arranged thereon and can generate a plasmon resonance, on a mask substrate; preparing a photoresist film that is formed on the surface of the resist substrate and is sensible to light having a wavelength (X); bringing the photomask into contact with the photoresist film; and exposing the photoresist film to light having a wavelength (Y) that is longer than the wavelength (X) and is shorter than the peak wavelength of a plasmon resonance band of the metal nano structure, thereby transferring a pattern of the metal film in the photomask onto the photoresist film.

5 Claims, 11 Drawing Sheets

FIG.1A

FORMING OF METAL FILM

PROCESS FOR PRODUCTION OF PHOTORESIST PATTERN

TECHNICAL FIELD

The present invention relates to a method for patterning a photoresist. More specifically, the present invention relates to a method for patterning a photoresist in a pattern that includes a nanopattern.

BACKGROUND ART

The processing resolution in photolithography technology, which forms the basis of semiconductor processing technology, has generally been improved by shortening the wavelength of the exposure light. For example, the resolution in EUV lithography technology that uses extreme ultraviolet light (EUV, wavelength 13.4 nm) is, currently, in the region of 20 nm to 30 nm. Nevertheless, because EUV exposure process is impossible in environmental atmosphere (i.e., under non-reduced pressure) as well as the equipment itself is very expensive, EUV lithography is not expected to be used widely.

Further, it has been learned that an exposure apparatus that uses an excimer laser (ArF, wavelength 193 nm) as a light source and an immersion lens for an optical system has a processing resolution of 30 nm, and thus extensive research into mass production of such an apparatus is being carried out. However, the limits of processing resolution based on wavelength have already been reached, so that a dramatic improvement in resolution is not anticipated. Therefore, it is expected that improvements in integration density and performance in semiconductor processing will reach their limit in the near future.

On the other hand, lithography technology that utilizes near-field light is known. This technology patterns a photoresist by utilizing the near-field light generated at the ends of a nanostructure.

An example of a competing nanopatterning technology is nanoimprinting. However, nanoimprinting suffers from the drawback that separation between the mold and the resist substrate is difficult.

CITATION LIST

Patent Literature

PTL 1
International Patent Application Publication No. WO2006/098446
PTL 2
International Patent Application Publication No. WO2006/092963

SUMMARY OF INVENTION

Technical Problem

In addition, the present inventor has previously filed a patent application (Japanese Patent Application No. 2009-011965) relating to the development of a technology for patterning a photoresist that is sensitive to shorter-wavelength light (e.g., UV light), by directing long-wavelength light (e.g., near-infrared light) through a metal nanostructure as a photomask in which two or more metal nanoparticles are spaced from each other at an interval of the order of nanometers. This technology is characterized by using an optical electric field enhanced by the gaps among the metal nanoparticles (so-called "near-field light"). According to this technology, a nanometer-scale (preferably single nanometer-scale) photoresist pattern can be realized.

Although fine patterning of a photoresist can be easily realized with this technology, the thickness of the photoresist film that can be patterned is in some cases not sufficient in practice. It is therefore an object of the present invention to provide a method for easily achieving fine patterning regardless of the wavelength of the exposure light, even for photoresist films having a predetermined thickness or more.

Solution to Problem

As stated above, the present inventor developed a method for patterning a photoresist film using an optical electric field enhanced by the nano gaps in a metal nanostructure (so-called "near-field light") by directing light with a wavelength that is longer than that of the light to which the photoresist is sensitive. However, although such exposure with near-field light using nano gaps can reduce the spatial spread in the planar direction to several nanometers, the spread in the depth direction is also restricted to the size in the planar direction, so that deep exposure is not achieved.

To overcome this drawback, the present invention has been accomplished to provide a method for patterning a photoresist film that utilizes a scattering component of light (propagating light) based on plasmon resonance by directing light with a wavelength that is longer than the light to which the photoresist is sensitive.

Specifically, the inventor discovered that when a plasmon is excited to the next higher resonance mode by irradiating a metal nanostructure, on which a metal film is arranged, with "light with a wavelength shorter than the peak wavelength of the plasmon resonance band of the metal nanostructure", a high optical electric field enhancement is induced not only at the ends but also in the middle portion of the metal film. Further, since this scattering component of light can propagate through the photoresist film, it was learned that the photoresist can be sensitized even if the photoresist film has a predetermined thickness or more.

Specifically, a first aspect of the present invention relates to the following methods for producing a photoresist pattern.

[1] A method for producing a photoresist pattern comprising: providing a photomask formed of a metal nanostructure that produces plasmon resonance, the metal nanostructure including a mask substrate having an irregular structure on a surface thereof and a metal film arranged on at least a protrusion of the irregular structure of the mask substrate; providing a photoresist film that is sensitive to light having a wavelength X, the photoresist being formed on a surface of a resist substrate; bringing the photomask into contact with the photoresist film; and transferring onto the photoresist film a pattern of the metal film of the photomask by exposing the photoresist film with a light having a wavelength Y that is longer than wavelength X and shorter than a peak wavelength of a plasmon resonance band of the metal nanostructure.

[2] The method for producing a photoresist pattern according to [1], wherein the metal film is arranged on the protrusion and a recess of the irregular structure.

[3] The method for producing a photoresist pattern according to [1] or [2], wherein a gap between metal films arranged on the mask substrate is in the range of 10 mm to 1 nm.

[4] The method for producing a photoresist pattern according to [1], wherein the wavelength X is an ultraviolet wavelength and the wavelength Y is a near-infrared wavelength or a visible light wavelength.

[5] The method for producing a photoresist pattern according to [1], wherein the exposure is carried out under non-reduced pressure.

A second aspect of the present invention relates to the following photolithography apparatus.

[6] A photolithography apparatus for performing photolithography of a photoresist sensitive to ultraviolet light using a photomask formed of a metal nanostructure that produces plasmon resonance, the metal nanostructure including a mask substrate and a metal film arranged on the mask substrate, the photolithography apparatus comprising: as an exposure light source, a halogen light source, a near-infrared light source, or a visible light source, wherein a wavelength of light from the exposure light source is shorter than a peak wavelength of a plasmon resonance band of the metal nanostructure.

Advantages Effects of Invention

According to the present invention, a pattern of a metal film arranged on a metal nanostructure used as a photomask can be easily transferred onto a photoresist film. Specifically, a pattern of a metal film arranged on a metal nanostructure used as a photomask can be transferred onto a resist film having a predetermined thickness or more by setting the wavelength of the exposure light so that it has a longer wavelength than that of the light that originally the resist is sensitive to, and has a shorter wavelength than the peak wavelength of the plasmon resonance band of the metal nanostructure.

Therefore, a general photoresist that is sensitive to UV light can be nano-patterned using a photolithography apparatus that employs an inexpensive light source (e.g., halogen light source). Consequently, a resist pattern that is finer than ever can be produced at a very low cost.

DESCRIPTION OF EMBODIMENTS

As stated above, the present invention is directed to a method that enables a nano-level processing resolution to be achieved in photolithography technology for patterning a photoresist.

1. Photomask

The photomask used in the photolithography according to the present invention has a mask substrate having an irregular structure on the substrate surface, and a metal film arranged on the surface of the mask substrate. The material of the mask substrate is not especially limited. For example, a glass substrate may be used. Note that the material of the mask substrate does not particularly have to be a transparent material. This is because the light used for exposure is incident by passing through a resist substrate (later described) rather than by passing through the mask substrate.

It is preferred that the surface of the mask substrate on which the metal film be arranged has an irregular structure. Although the metal film is arranged on at least protrusions of the mask substrate surface having an irregular structure, the metal film may also be arranged on recesses. Forming the mask substrate surface so as to have an irregular structure enables the mold release properties after exposure to be improved while increasing the adhesion between the photomask's protrusions and the photoresist film. Specifically, when the surface of the mask substrate is flat, a gap is easily formed between the mask substrate and the resist film, which makes it more difficult for these members to adhere to each other. Further, even if the surface of the photomask (the face contacting the resist film) has been contaminated, the photoresist can be easily restored by removing the metal film and then re-depositing a metal film (by sputtering or vapor deposition).

Further, forming the mask substrate surface so as to have an irregular structure and arranging a metal film on the protrusions of the irregular structure makes it easier for the scattering component of light based on the localized plasmon resonance caused by exposure to propagate in the thickness direction of the photoresist film. Specifically, since an air layer between the mask substrate and the resist film is eliminated, it is easier for the scattering component of light to propagate through the photoresist film. Consequently, patterning is easier even for a photoresist film having a predetermined thickness or more.

When forming the mask substrate surface so as to have an irregular structure, it is preferred that the difference between the protrusions and the recesses (step difference) is 30 nm to 100 nm.

The material of the metal film arranged on the mask substrate is often gold, silver and the like. However, the material is not especially limited, as long as it causes plasmon resonance to occur. The plasmon resonance band can be adjusted to a desired range based on the choice of the material for the metal film.

The size of the metal film arranged on the mask substrate (depending on e.g., the thickness as measured from the mask substrate surface, the surface area when viewed from a normal direction of the mask substrate surface) can be arbitrarily set, as long as such size has a plasmon enhancement effect. The plasmon resonance band can be adjusted to a desired range by appropriately controlling the size of the metal film. Further, by thinning the metal film, the plasmon resonance wavelength can be shifted to longer wavelengths. Consequently, shorter wavelengths of the plasmon resonance band can be excited even with a near-infrared light source.

The arrangement pattern of the metal film on the metal nanostructure is not especially limited. The gap distance between the metal films is also arbitrary. The term "gap" as used herein means the "length of the shortest interval" between metal films arranged on the protrusions of the irregular structure on the mask substrate. This gap corresponds to the gap between the protrusions of the irregular structure on the mask substrate. This gap can be adjusted to a range of 10 mm to 1 nm, and a pattern reflecting that gap can be realized. The shape of the metal film itself is also arbitrary. The shape of the metal film may be, for example, a line shape, a dot shape and the like.

Production of the metal nanostructure serving as a photomask in the present invention The method for producing the metal nanostructure serving as a photomask is not especially limited. Specifically, the production process will be briefly described with reference to FIG. 1.

Figure 1A:
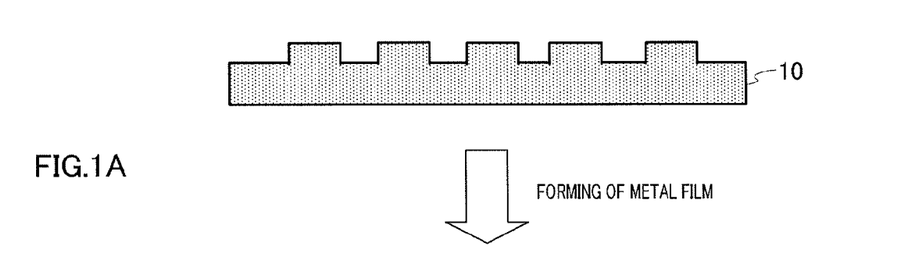
FIG. 1 illustrates an example of the production process of a metal nanostructure used as a photomask according to the present invention.

First, mask substrate 10 is provided (FIG. 1A). The material of mask substrate 10 is, for example, glass. The surface of mask substrate 10 has an irregular structure. This irregular structure is drawn based on the pattern that the operator wishes to realize.

Figure 1B:
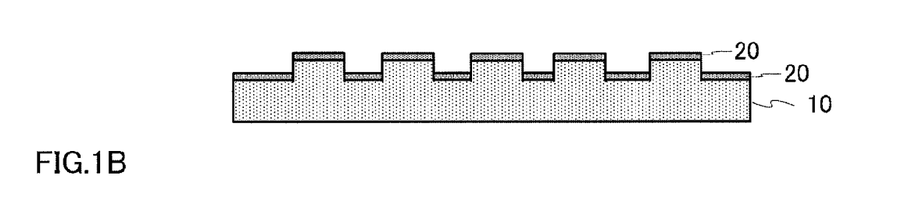

Metal film 20 is formed on the surface of mask substrate 10 (FIG. 1B). Metal film 20 can be formed by, for example, sputtering or vapor deposition. Metal film 20 is not especially limited as long as it exhibits plasmon resonance absorption. For example, metal film 20 may be gold. Further, metal film 20 may be a multi-layer structure, for example, a two-layer structure of a chromium film having high adhesion properties and a gold film. The thickness of the gold of metal film 20 may be, for example, 10 nm. Metal film 20 may be arranged on the protrusions of mask substrate 10, or may also be, as illustrated in FIG. 1B, arranged on the recesses.

Thus, as long as mask substrate 10 having the desired irregular structure can be provided, it is possible to provide a photomask according to the present invention very conveniently. Further, a pattern corresponding to the irregular structure of mask substrate 10 can be realized. In addition, when the photomask metal film has been damaged or contaminated, the photomask can be easily reproduced by removing the metal film and depositing a metal film again.

2. Photoresist Film to be Patterned

The photoresist used in the photolithography according to the present invention is not especially limited, as long as it is a resist that has non-linear photoreactivity. The term "resist that has non-linear photoreactivity" refers to a resist that undergoes reactions by selective sensitization with a light of a particular wavelength.

It is preferred that the photoresist used in the method according to the present invention is a resist that is sensitive to UV light. UV light refers to a light having a wavelength from about 10 to about 400 nm, but the UV light is preferably near UV light. For example, it is preferred that the photoresist is sensitive to g-line (435 nm), h-line (405 nm), and i-line (365 nm) light.

The photoresist may be a negative-type resist or a positive-type resist. A "negative-type resist" refers to a resist whose solubility to a developing solution decreases upon exposure to light, so that the exposed portions remain after exposure. A "positive-type resist" refers to a resist whose solubility to a developing solution increases upon exposure to light, so that the exposed portions are removed. It is generally said that fine patterning is carried out more easily with a positive-type resist. Even for nanopatterning as in the present invention, a positive-type resist may be suitable.

Although the thickness of the photoresist film to be patterned is not especially limited, according to the present invention, a photoresist film having a thickness of 5 nm or more can be patterned, and even a photoresist film having a thickness of 100 nm or more can be patterned. However, if the resist film is too thick, it may require a long time for the resist film to undergo photoreactions sufficiently. Therefore, the thickness is usually less than 150 nm, although it is not especially limited thereto.

The photoresist film can be formed on the surface of any desired resist substrate. The photoresist film can be formed by any of the methods known in the art, for example by spin coating. Examples of the resist substrate on which the photoresist is formed include a semiconductor substrates (wafers) of gallium arsenide, silicon carbide, silicon and the like, as well as glass substrates, sapphire substrates, polymer substrates of polystyrene/PET/PMMA and the like, and crystal substrates of titanium dioxide and the like.

The resist substrate may need to have a certain level of transparency to the exposure light. This is because the exposure light may be directed on the resist film through the resist substrate. Since most semiconductors are transparent to near-infrared light, most semiconductor substrates can be used as the resist substrate according to the present invention. For example, as long as it has a predetermined thickness or less, even a silicon substrate can be considered to be transparent to near-infrared light.

3. Exposure Light

The light to be directed on the photoresist film (exposure light) includes light that causes plasmon absorption on the metal nanostructure, a photomask, and the wavelength Y of that exposure light has the following features.

Feature 1: Wavelength Y is longer than the wavelength of light to which the resist in the photoresist film is sensitive (wavelength X).

Feature 2: Wavelength Y is shorter than the peak wavelength of the plasmon resonance band of the metal nanostructure serving as the photomask.

Light that causes plasmon absorption on the metal nanostructure is, for example, light with a wavelength of 510 nm or longer where the metal film of the metal nanostructure is gold; and light with a wavelength of 400 nm or longer where the metal film of the metal nanostructure is silver,. Generally, the light preferably has a near-infrared wavelength or a visible light wavelength, with light with a wavelength of 600 to 1,200 nm being more preferred. On the other hand, excluding some metals such as aluminum, generally plasmons cannot be excited with UV light.

As stated above, the wavelength (wavelength X) of the light at which the resist in the photoresist film is sensitive depends on the type of resist. However, whatever the case, the wavelength of the exposure light (wavelength Y) needs to be longer than wavelength X (feature 1). For example, when the resist is sensitive to UV light, it is preferred to expose it with light having a near-infrared wavelength or a visible light wavelength.

In addition, the wavelength of the exposure light (wavelength Y) needs to be shorter than the absorption peak wavelength (also referred to as "peak wavelength of the plasmon resonance band") of the plasmons generated by the metal nanostructure serving as the photomask. When the wavelength of the exposure light (wavelength Y) is shorter than the peak of the plasmon resonance band of the metal nanostructure, the plasmons are excited to the next higher absorption mode, so that a high optical electric field enhancement is induced not only at the ends but also in the middle portion of the metal film.

When the plasmons are excited to the next higher absorption mode, that scattering component of light is reflected in the shape of the structure. Generally, even when plasmons are excited only to the next lower absorption mode, light is extremely spatially and selectively localized, such as at both ends of the metal structure (metal film) of the metal nanostructure, or a nano gap region or the like, and the distribution of that scattering component of light is also localized. Specifically, only the nano gap regions are exposed, so that a pattern reflecting the shape of the photomask metal is not realized.

The plasmon resonance band of the metal nanostructure can be adjusted based on the size and the material of the metal film arranged on the protrusions of the irregular structure of the mask substrate. Generally, the peak of the plasmon resonance band shifts to shorter wavelengths when the thickness of the metal film is made thicker (in range of about 10 to 100 nm), and shifts to longer wavelengths when the thickness is made thinner. Further, this peak shifts to longer wavelengths when the size (vertical by horizontal) of the metal film structure is increased, and shifts to shorter wavelengths when the size is reduced.

In addition, when the gap width between the metal films arranged on the protrusions of the irregular structure of the mask substrate is reduced, the plasmon resonance band shifts to longer wavelengths. For example, when the gap width between the metal films is 20 nm or less, compared with when the gap width is 100 nm, the peak of plasmon resonance band shifts to longer wavelengths. More specifically, when the peak is about 700 nm in the case where the gap width is 100 nm, the peak shifts to longer wavelengths by about 100 nm when the gap width is 20 nm or less.

When the gap width between the metal films arranged on the protrusions of the irregular structure of the mask substrate is of the order of nanometers so that near-field light is generated at that gap region, the polarization direction of the exposure light needs to be appropriately set. Specifically, the polarization direction of the exposure light needs to be set perpendicular to the gap direction (direction of the line connecting the two closest points). On the other hand, when the polarization direction of the exposure light is set parallel to the gap direction, the resist may be sensitized by near-field light at the gap region, so that the metal pattern of the mask substrate may not be suitably reflected.

However, even if the gap width between the metal films arranged on the protrusions of the irregular structure of the mask substrate is of the order of nanometers so that near-field light is generated at that gap region, when the resist film is thick (e.g., 70 nm or more), there are cases in which it is not necessary to adjust the polarized light (there are cases where non-polarized light is acceptable). This is because since the region exposed with near-field light is only the resist surface (portion several to several tens of nanometers from the surface), even if the gap region is exposed with near-field light, there is no negative impact on the pattern.

The plasmon resonance band of the metal nanostructure can be measured based on absorption spectrum measurement under a microscope. Specifically, light from a halogen light for microscope illumination (upright optical microscope (Olympus, BX-51)) is directed on the metal nanostructure through a condenser lens. The light transmitted through the metal nanostructure is collected by an objective lens (×40), and guided through a 200 μm-diameter pinhole to a spectrophotometric detector. When the light transmitted through the portion where the metal film of the metal nanostructure is arranged is I, and the light transmitted through the portion where the metal film is not arranged (glass substrate) is $I_0$, the absorption value is calculated as $-\log(I/I_0)$. Since a spectrophotometric detector is used for detection, the light absorption spectrum is measured by determining the absorption value at each wavelength.

Further, when the metal nanostructure is a metal laminate produced with a large surface area of 1 mm diameter or more, the absorption spectrum can be measured even with a common UV-visible light spectrophotometer (spectrometer).

The absorption spectrum of the metal nanostructure should be measured with a resist identical to the resist film to be patterned being coated (preferably to a thickness of 100 nm or more) on the surface on which the metal film of the metal nanostructure is arranged. This is because the absorption spectrum shifts depending on whether air or a resist film is on the surface of the metal nanostructure. Specifically, since the refractive index of the resist is higher than the refractive index of air, the absorption spectrum shifts to longer wavelengths when the resist is coated. Since the metal nanostructure according to the present invention is used as a photomask for patterning a resist film, the absorption or scattering component of light spectrum should be measured under the presence of a resist film.

As stated above, the wavelength of the exposure light (wavelength Y) needs to be shorter than the peak wavelength of the plasmon resonance band of the metal nanostructure. Although the absolute value of the difference between the wavelength Y and the peak of the plasmon resonance band is not especially limited, it may be, for example, 50 to 200 nm.

In the method according to the present invention, a photoresist film is sensitized by a sensitizing reaction with the scattering component of light based on localized surface plasmon resonance of a metal nanostructure on which a metal film is arranged. The scattering component of light is generated not only at the ends of the metal film, but also in the middle portion too, and this scattering component of light is propagated through the photoresist film. Consequently, a resist pattern that more suitably reflects the shape of the metal film of the mask can be formed even for a photoresist film having a predetermined thickness or more. Further, since patterning can be carried out even for a photoresist film having a predetermined thickness or more, a pattern having a high aspect ratio can be obtained.

The light directed on the photomask may be from a pulse laser, a continuous oscillation wavelength (CW) laser, a halogen lamp or the like. When the light is from a halogen lamp, it is preferred to filter the light and direct only a light component having a desired wavelength (e.g., wavelength of 600 nm to 900 nm).

4. Production Flow of Photoresist Pattern

The patterning of the photoresist according to the present invention is carried out by, first, bringing a photomask formed from a metal nanostructure into contact with a photoresist film deposited on a resist substrate. It is preferred that a face on which the metal film of the metal nanostructure, which serves as the photomask, is arranged is brought into contact with the photoresist film.

The term "contact" as used herein encompasses "intimate contact" accomplished by pressing the photomask against the resist film at a predetermined pressure. When the photomask is brought in intimate contact with the photoresist film, the processing resolution can be improved. When the surface of the photomask according to the present invention is made to have an irregular structure, the mold release properties improve, which allows the photomask to be brought in intimate contact with the resist film.

Next, light with a wavelength Y is directed on the resist film (resist film is exposed). The exposure light may be directed from the resist substrate side or from the mask substrate side. However, usually, the exposure light is directed from the mask substrate side. As stated above, the light with a wavelength Y is light that causes plasmon absorption to occur on the metal nanostructure, has a wavelength that is longer than the wavelength X used to expose the resist and is shorter than the peak of the plasmon resonance band of the metal nanostructure.

In order to direct light over the entire surface of the photoresist film formed on the substrate, light is preferably swept over the entire surface of the resist film for exposure. The resist can be thoroughly sensitized by decreasing the sweeping speed. Throughput can be improved and therefore productivity increased by increasing the scanning speed.

Exposure does not have to be carried out under reduced pressure, it can be carried out under non-reduced pressure (in environmental atmosphere). Specifically, it is not necessary to perform exposure under a reduced pressure as in EUV lithography, the method of the present invention is simple.

After exposure has finished, development is carried out with a developing solution. For a positive-type resist, the exposed portions are removed. For a negative-type resist, the non-exposed portions are removed. After development, the intended circuits and the like can be produced using the pattern drawn with the resist.

Figure 2A:
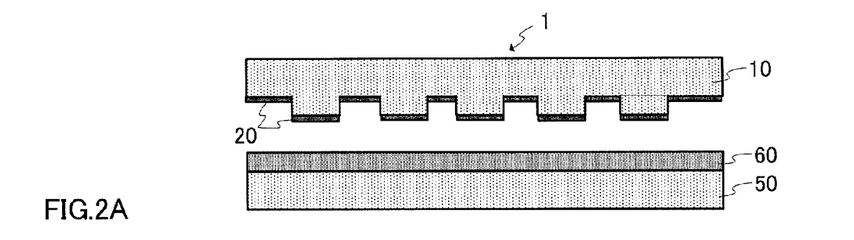
FIG. 2 illustrates the production flow of a photoresist pattern according to the present invention.

FIGS. 2A to 2E illustrate an example of producing a photoresist pattern using a positive-type resist and of producing a circuit based on a deposition/lift-off step. In FIG. 2A, metal nanostructure 1 is brought in intimate contact with positive-type photoresist film 60 formed on resist substrate 50. Metal nanostructure 1 is formed of transparent mask substrate 10 and metal film 20. Although the resist in positive-type photoresist film 60 is inherently sensitive to UV light, in this example a resist is employed that is not sensitive to near-infrared light.

Figure 2B:
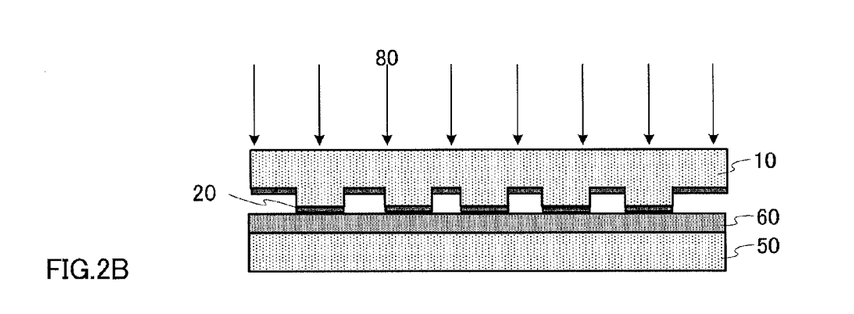

In FIG. 2B, near-infrared light 80 is directed from the mask substrate 10 side of metal nanostructure 1 that is brought in intimate contact with photoresist film 60 (i.e., contact exposure is performed). Consequently, near-infrared light is directed on regions of the resist where metal film 20 is not arranged, but the resist in these regions is not sensitized. On the other hand, since the scattering component of light based on localized surface plasmon resonance acts on the resist in the regions where metal film 20 is arranged, the resist in those regions is sensitized.

Figure 2C:
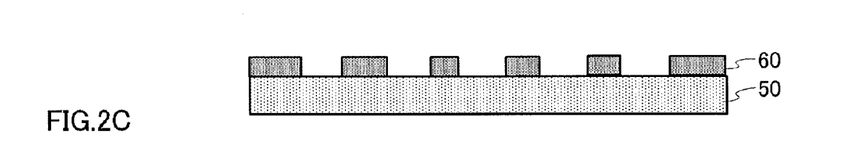

FIG. 2C illustrates a state in which the sensitized regions of the resist in the photosensitive regions have been removed by development. Specifically, the resist in the regions where metal film 20 has been arranged is removed. A nano-level pattern is thus realized that corresponds to metal film 20 of the photomask.

Figure 2D:
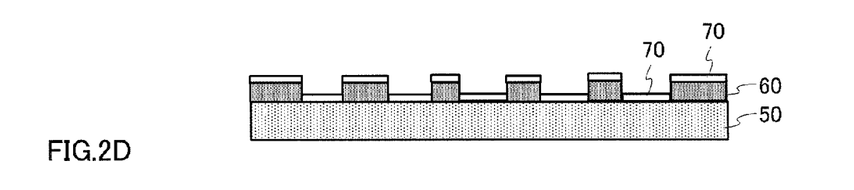
Figure 2E:
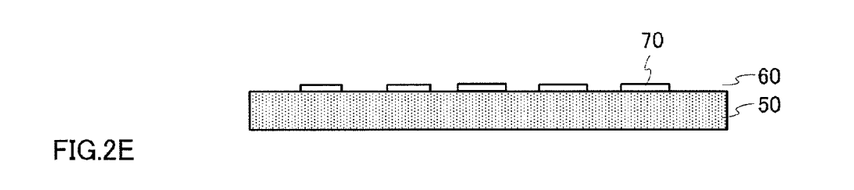

FIG. 2D illustrates a state in which gold film 70 has been deposited on the patterned resist film by sputtering. The method for film deposition is not limited to sputtering. Further, the component to be deposited is also not especially limited. FIG. 2E illustrates a state in which gold film 70 having a pattern identical to that of metal film 20 in the photomask metal nanostructure 1 has been formed by lifting off. The pattern of metal film 20 in the photomask metal nanostructure 1 can be transferred in this way.

5. Photolithography Apparatus

A photolithography apparatus according to the present invention is an apparatus for performing photolithography using the above-described photomask. More specifically, the photolithography apparatus can expose a photoresist that is sensitive to UV light while having a halogen light source, a near-infrared light source, or a visible light source as an exposure light source. Further, the above-described exposure light source may be a pulse light source or a continuous oscillation light source. In addition, the photolithography apparatus according to the present invention may have parts similar to those of typical lithography apparatus.

EXAMPLES

The present invention will now be described in more detail with reference to the accompanying drawings.

First, referring to FIGS. 3A to 3F, the mechanism by which the scattering component of light sensitizes the photoresist based on localized surface plasmon resonance will be described with reference to the results of an FDTD simulation.

Figure 3A:
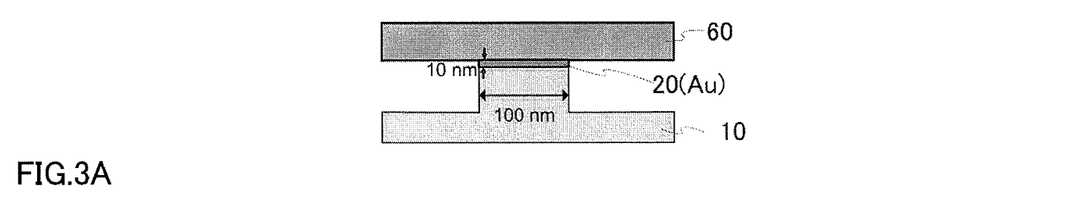
FIG. 3 illustrates the production mechanism of a photoresist pattern according to the present invention.

In the FDTD simulation, an imaginary photomask was fabricated in which chromium or titanium was deposited to a thickness of the order of 1 to 2 nm as an adhesion layer on the protrusions of a glass substrate having a 100 nm-sized irregular structure, and gold was deposited thereon to thickness of the order of 10 nm (FIG. 3A). The peak of the plasmon resonance band of the photomask was 880 nm in the FDTD simulation, and the experimental value (the measured value of an actually produced photomask) was 870 nm. Then, the face on which the gold was arranged in the obtained photomask was brought in intimate contact with a positive-type photoresist having a thickness of about 70 nm, and laser light with a wavelength of 800 nm was made incident thereon (see FIG. 3A).

Figure 3B:
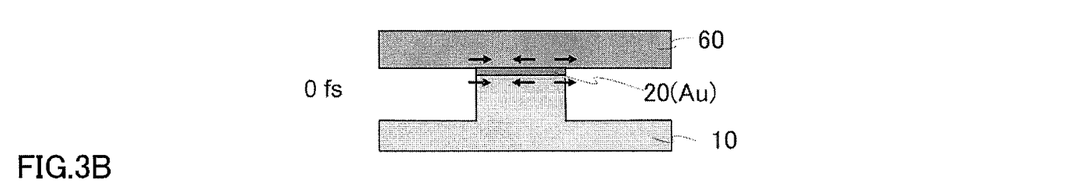
Figure 3C:
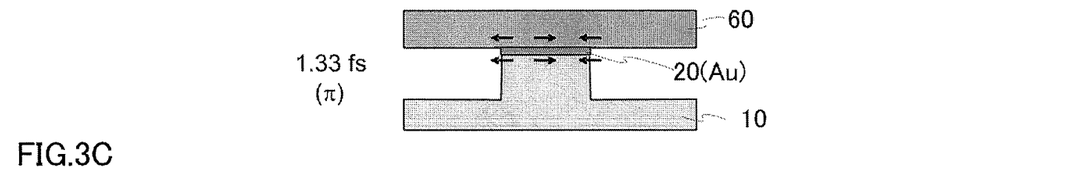

The period of one wavelength of a 800 nm-wavelength laser light is 2.66 femtoseconds. Let us assume two states after incident of one wavelength of a 800 nm-wavelength laser light: a state at the moment when the laser light has just reached the gold (after 0 femtosecond); and a state at 1.33 femtoseconds after the laser light reached the gold (half one cycle). At 0 femtosecond, as illustrated in FIG. 3B, collective motion of the free electrons on the gold surface is induced by the electric field component of the light, so that the electrons move in the opposite direction to the electric field component of the light at both ends of the metal. film. Further, at 1.33 femtoseconds, as illustrated in FIG. 3C, collective motion of the free electrons (plasma oscillation) is induced in the reverse direction.

Plasma oscillation will now be described in more detail. When light waves (an electric field) reach a metal, the negatively charged electrons move in the opposite direction to the electric field at a given resonance frequency, and immediately become an electron-hole pair (state in FIG. 3B). Then, the electrons move back again in the reverse direction (state in FIG. 3C). This is called plasma oscillation. Plasma oscillation continues for about 20 femtoseconds. Although the incident light passes by in subfemtoseconds, the phase relaxation duration of this plasma oscillation continues for up to about 10 femtoseconds, so that optical electric field enhancement is induced.

It was learned from the simulation results that by designing the gold film so that one side is 100 nm and the thickness is 10 nm, an electric quadrupole moment could be excited, and that the electrons can move in the opposite direction to that at either end of the structure even in the middle of the gold film. Further, it was also learned from the FDTD simulation results that the above-described plasma resonance continued for about 20 femtoseconds.

By making the gold film thinner, a peak wavelength of the plasmon resonance of the metal structure of 890 nm could be obtained even for a structure having 100 nm sides. Consequently, shorter wavelengths can be excited even with an 800 nm laser, so that a plasmon resonance electric quadrupole moment can be induced.

Similar to an antenna, in an electric quadrupole moment the charge bias repeats plus-minus-plus and minus-plus-minus plasma oscillations (the dipoles repeat plus-minus and minus-plus). When this repetition is illustrated as electron movement, as illustrated in FIGS. 3B and 3C, the electrons repeat plasma oscillations in the direction of the arrows.

Figure 3D:
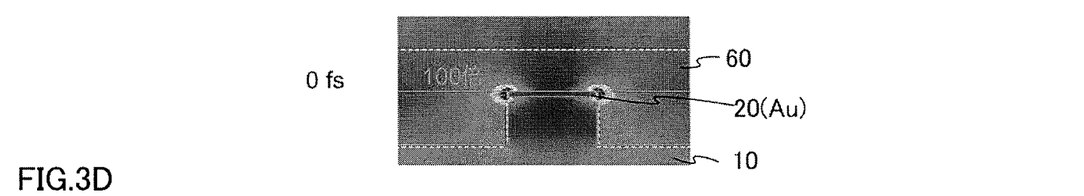
Figure 3E:
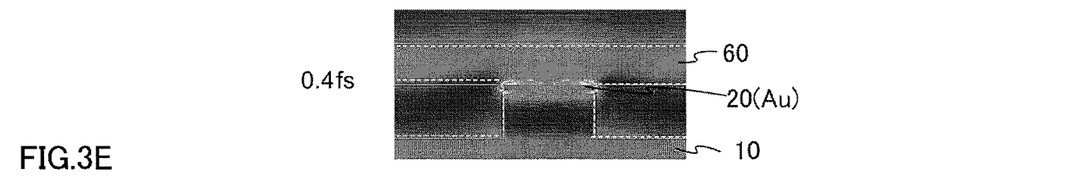
Figure 3F:
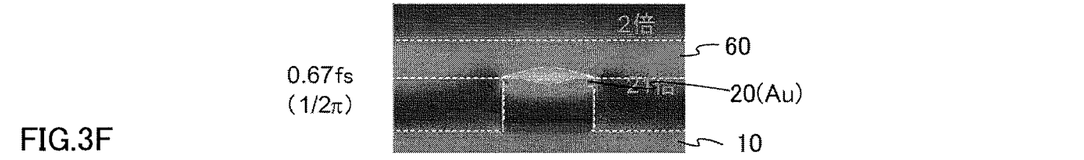

FIGS. 3D to 3F illustrate the calculations of electric field intensity. At 0 femtoseconds, strong near-field light (electric field intensity was about 100-fold) is present at either end of the structure (gold film). Subsequently, at 0.4 femtoseconds (FIG. 3E) and 0.67 femtoseconds (FIG. 3F), the simulation demonstrated how the scattering component of light propagated through the resist interior. The present invention sensitizes a resist film by utilizing this propagating scattering component of light.

It was learned from the simulation that light with approximately doubled intensity (two-fold electric field intensity) is directed at the bottom face of the resist having a thickness of 70 nm. Further, at the portion where the depth of the resist film in the middle region of the metal film was 35 nm, the electric field intensity increased 6 folds, and in the vicinity of the surface center, the electric field intensity increased 21 folds.

SEM and AFM Observation

In the following Examples 1 and 2, a sample (a photomask or a photoresist pattern) was observed by electron micrography. The observation by electron micrography was carried out using a field emission scanning electron microscope (FE-SEM) (JSM-6700FT, JEOL Ltd.). The arrival resolution at an electron accelerating voltage of 15 kV was 1 nm.

Example 1

Formation of the photoresist pattern according to the present invention and the results thereof are illustrated with reference to FIGS. 4A to 4E. First, a glass substrate having protrusions each measuring 110 nm×110 nm×110 nm was provided. Then, 10 nm-thickness gold was deposited on the protrusions to obtain a photomask (gold block structure 1). FIG. 4B illustrates the gold pattern on the obtained photomask. The peak of the plasmon resonance of the obtained photomask was 880 nm.

On the other hand, a photoresist substrate was obtained by coating a photoresist on resist substrate 50 made of glass to deposit photoresist film 60. Although TSMR-V90 from Tokyo Ohka Kogyo was used as the photoresist, the same results were obtained even for an i-line resist like TDMR-AR80. The thickness of the photoresist film was 70 nm.

Figure 4A:
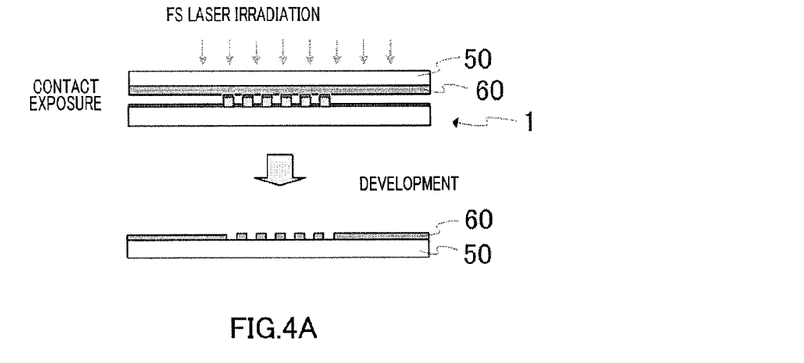
FIG. 4 illustrates the production of a photoresist pattern according to Example 1.
Figure 4B:
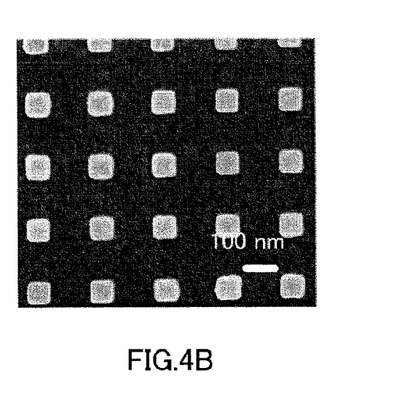

As illustrated in FIG. 4A, the photoresist film was brought in intimate contact with the deposition face of the gold on the photomask. This photoresist film was irradiated for 29 femtoseconds with a laser (wavelength 800 nm, 120 fs, 82 MHz, 50 W/cm$^2$). After the irradiation, developing was carried out with a developing solution (NMD-3, Tokyo Ohka Kogyo).

Figure 4C:
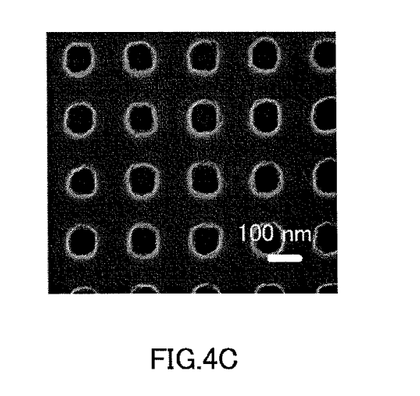
Figure 4D:
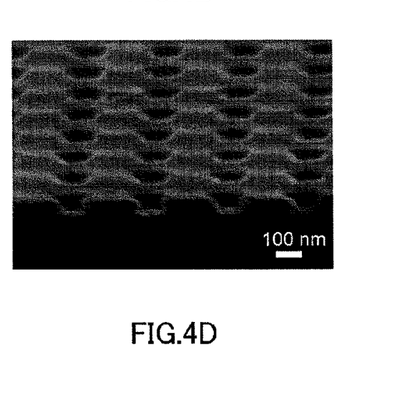
Figure 4E:
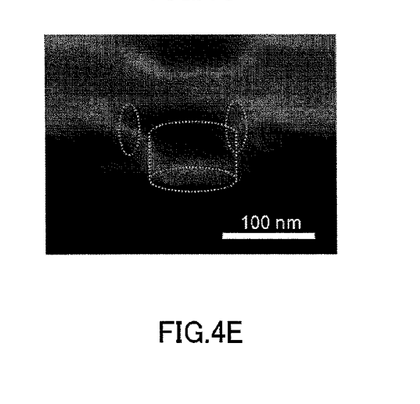

FIG. 4C is an electron micrograph of the upper face of the developed resist pattern. FIGS. 4D and 4E are electron micrographs of the upper face of the developed resist pattern. It can be seen from these electron micrographs that the resist film was exposed as far as the bottom face, and that development was achieved.

A pattern is formed by a two-photon reaction at the g-line resist and a three-photon reaction at the i-line resist. From the cross-sectional electron micrographs (FIGS. 4D and 4E), it is suggested that at the resist surface a pattern is achieved by near-field exposure light, while inside the resist a pattern is achieved by the propagation of the scattering component of light. At the surface vicinity of the resist film, sites with a high optical electric field intensity are exposed based on plasmon resonance, so that exposure based on the optical electric field intensity profile of the metal nanostructure is achieved. On the other hand, inside or deep in the resist, exposure based on the intensity distribution of scatted light based on plasmon resonance is achieved. These results showed a good agreement with the results of the FDTD simulation.

Figure 5A:
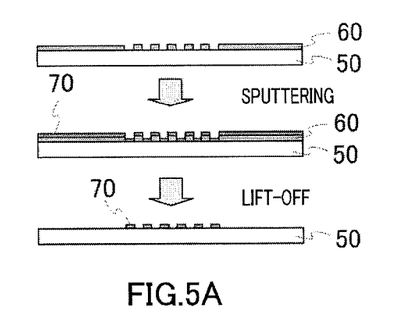
FIG. 5 illustrates a gold pattern produced by lift-off using the photoresist pattern produced in Example 1.

To confirm whether the photoresist film patterned by lithography that is illustrated in FIG. 4 achieved exposure and development as far as the bottom face of the resist substrate, 7 nm-thick gold 70 was deposited by sputtering on the photoresist pattern obtained in FIG. 4, and then lift-off was carried out (FIG. 5A).

Figure 5B:
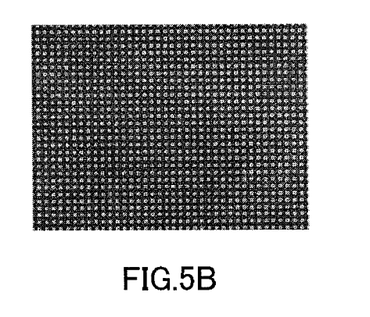
Figure 5C:
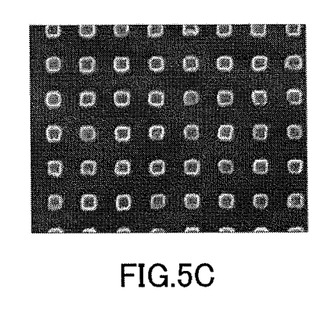

FIGS. 5B (10,000× magnification) and 5C (50,000× magnification) are electron micrographs of gold block structures obtained by lift-off. As illustrated in FIGS. 5B and 5C, it is clear that gold block structures having sides of about 140 nm were transferred onto the entire surface area irradiated with light. Specifically, it was demonstrated gold block structures can be produced by nano-photolithography/lift-off.

Figure 5D:
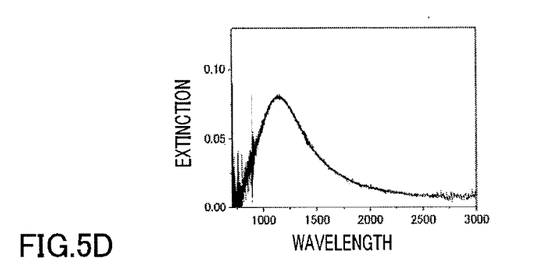

Further, as illustrated in FIG. 5D, the gold block structures illustrated in FIGS. 5B and 5C provided a plasmon resonance spectrum. In addition, evaluation of the gold block size distribution of the gold block structures illustrated in FIGS. 5B and 5C by high resolution SEM showed that size variation was 3.8 nm based on standard deviation.

Figure 5E:
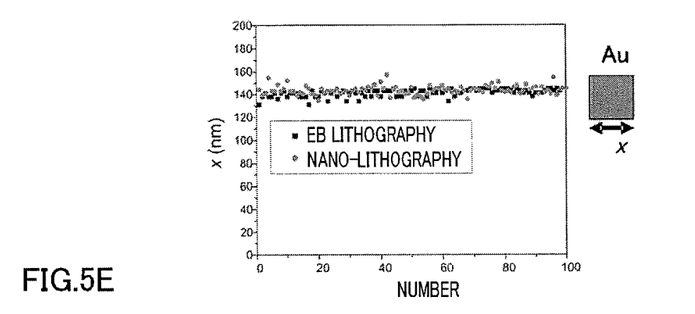

It is reported that variation in the size of gold block structures produced by electron beam lithography/lift-off is 3.2 nm (JACS, 128, 14226, 2006). A graph that plots gold block structure sizes produced by nano-lithography in comparison with the reported data is given in FIG. 5E. As illustrated in FIG. 5E, the photolithography technology according to the present invention has the same processing resolution as electron beam lithography, and thus clearly has a single-nanometer processing resolution.

Figure 6A:
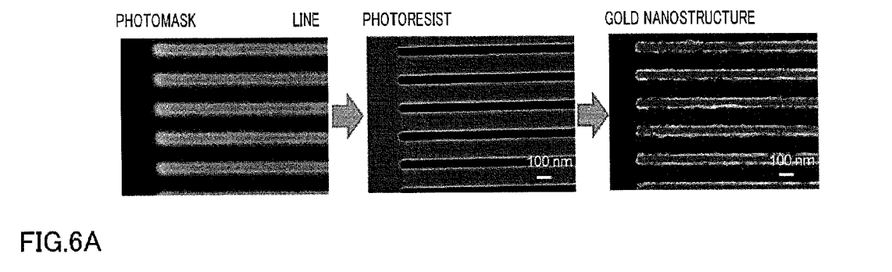
FIG. 6 illustrates photoresist patterns produced using various photomasks and gold patterns produced by lift-off using those photoresist patterns.
Figure 6B:
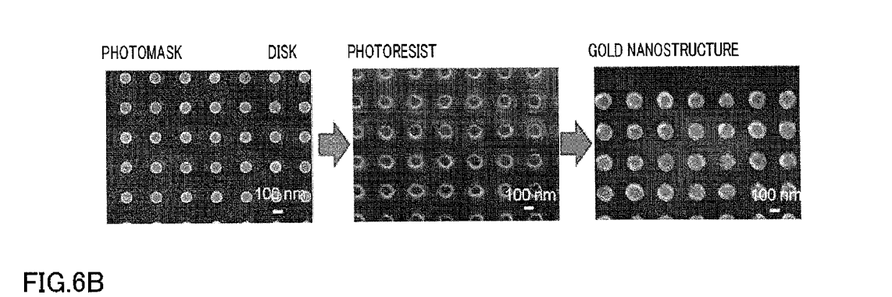
Figure 6C:
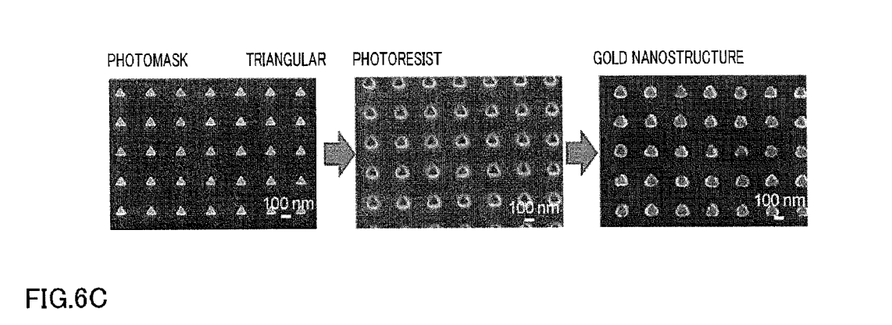

A photoresist can be patterned under the same exposure conditions using not only a photomask having the square-shaped metal film illustrated in FIG. 4B, but also a photomask having a metal film with a line-and-space structure (FIG. 6A), a photomask having a disk-shaped metal film (FIG. 6B), or a photomask having a triangular metal film (FIG. 6C). Further, it was also learned that a metal nanostructure can be produced using a patterned resist.

Figure 7A:
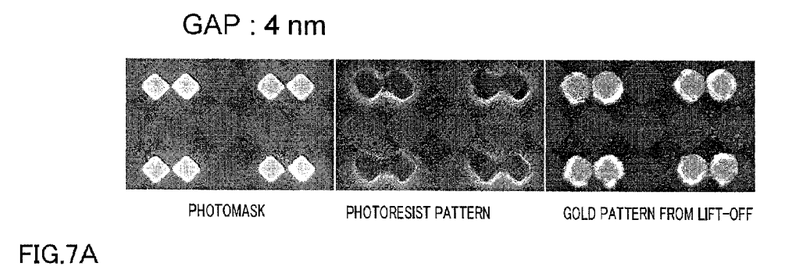
FIG. 7 illustrates a photoresist pattern produced using a photomask having a dimer structure metal film, and a gold pattern produced by lift-off using that photoresist pattern.
Figure 7B:
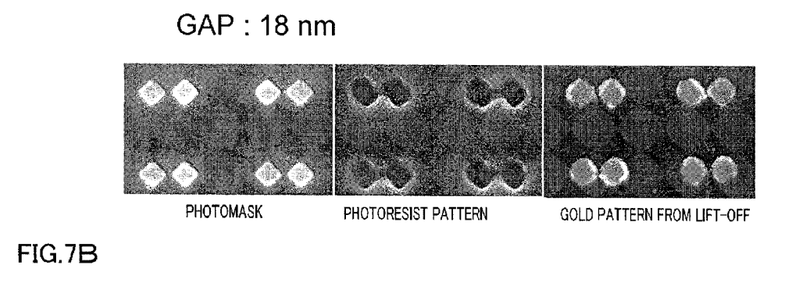
Figure 7C:
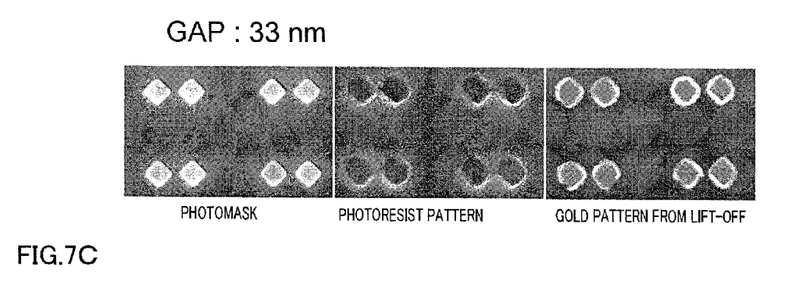
Figure 7D:
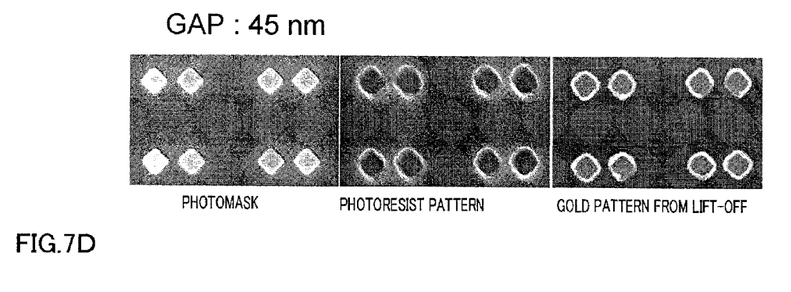

Further, according to the patterning method of the present invention, the gap between patterns can also be controlled at a nanometer scale. FIG. 7A illustrates an example in which a photomask was used that has two gold films with a 4 nm gap between them. FIG. 7B illustrates an example in which a photomask was used that has two gold films with an 18 nm gap between them. FIG. 7C illustrates an example in which a photomask is used that has two gold films with a 33 nm gap between them. FIG. 7D illustrates an example in which a photomask is used that has two gold films with a 45 nm gap between them.

It can be seen that in all of FIG. 7A to 7D, a resist pattern is realized, and that a gold pattern (gold thickness of 7 nm) having a gap that corresponds to the photomask can be produced by lift-off.

Figure 8A:
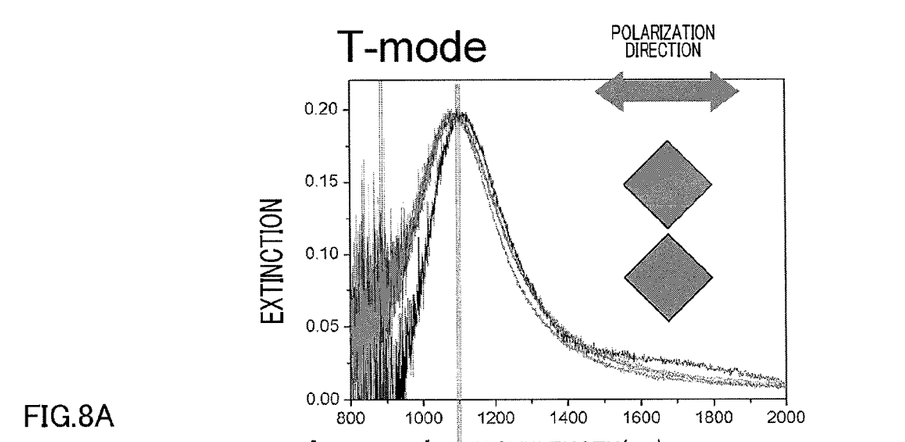
FIG. 8 is a graph illustrating a plasmon resonance spectrum of the metal pattern produced in FIG. 7.
Figure 8B:
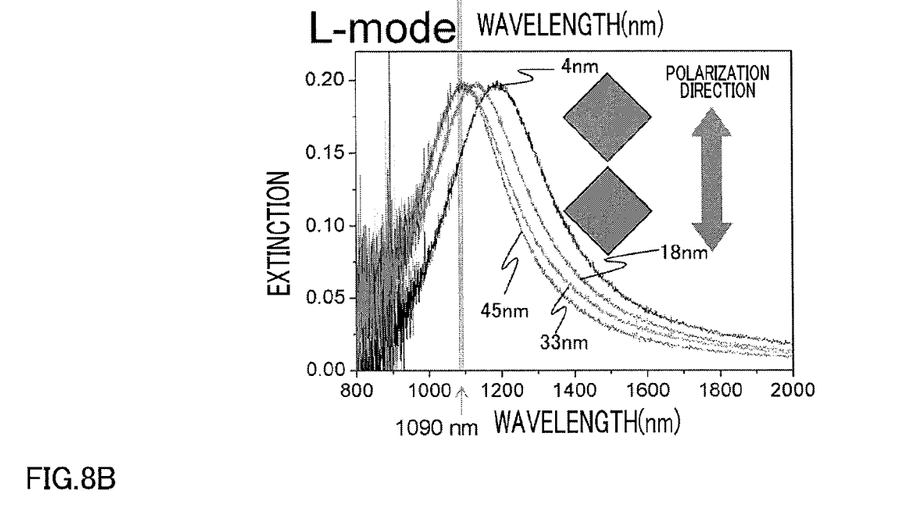

The absorption spectra of the gold patterns produced by lift-off in FIGS. 7A to 7D were measured. The measurement was carried out for each polarization with respect to the gold pattern array (FIG. 8A and 8B). FIG. 8A illustrates a case in which the measurement was performed using polarization perpendicular to the array direction of the dimers forming the gold pattern. FIG. 8B illustrates a case in which the measurement was performed using polarization parallel to the array direction of the dimers forming the gold pattern.

As illustrated in FIG. 8A, when polarization perpendicular to the array direction of the dimers was used, there was no change in the spectrum for any of the gold patterns obtained in FIGS. 7A to 7D. On the other hand, as illustrated in FIG. 8A, when polarization parallel to the array direction of the dimers was used, the spectrum changed for each of the gold patterns obtained in FIGS. 7A to 7D. Specifically, as the gap became narrower, the plasmon resonance spectrum systematically shifted to longer wavelengths (the peak wavelength shifted due to electromagnetic interaction among the plasmons and dipole-dipole interaction). Based on this result, it was also confirmed that a nano gap was formed.

Example 2

Production of Photomask

Figure 9A:
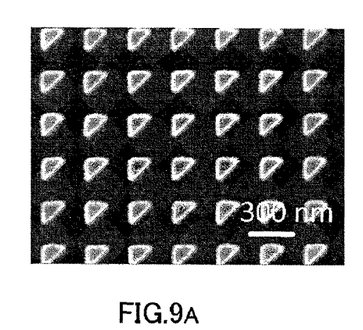
FIG. 9A illustrates a photomask produced in Example 2.
Figure 10A:
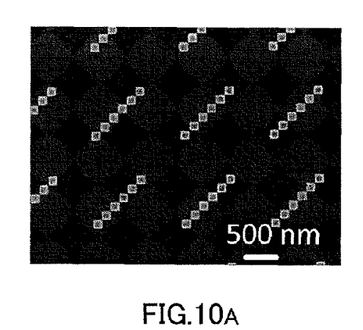
FIG. 10A illustrates a photomask produced in Example 2.

Next, the photomask illustrated in FIGS. 9A and 10A was obtained based on the following procedure. A negative EB resist (XR-1541, Dow Corning Co.) film was deposited by spin coating on a Matsunami glass substrate (24 mm×24 mm). The spin coating conditions were 10 seconds at 1,000 rpm, and then seconds at 2,000 rpm. The deposited resist film was pre-baked on a hot plate. The pre-baking conditions were 1 minute at 150° C., and then 2 minutes at 200° C.

A nanostructure was formed by high-resolution electron beam lithography (EBL) on the pre-baked resist film. The EBL was carried out using an electron beam lithography apparatus (ELS-7700H, Elionix SEM), at a dose of 1,600 $\mu C/cm^2$ and a current value of 10 pA.

The photomask was obtained by laminating a two-layer metal layer of a chromium layer and a gold layer on the development target face of the developed glass substrate. The chromium layer thickness was 2 nm, and the gold layer thickness was 10 nm. The two-layer metal layer was formed by sputtering (ULVAC, MPS-4000).

The photomask illustrated in FIG. 9A has triangular prism-shaped gold nanoparticles on a glass substrate. The gold nanoparticles are aligned in a matrix at a period of 300 nm. As illustrated in FIG. 9C, the average of the length L of one side of the gold nanoparticles was 141.2 nm, with a standard deviation of 4.4 nm.

The photomask illustrated in FIG. 10A has a chain structure in which square nanoparticles are linked together. The minimum width of the linking portions between the nanoparticles was 10 nm (see FIG. 10C).

Photoresist Patterning

On the other hand, a positive photoresist (TSMR V-90, Tokyo Ohka Kogyo) film was deposited by spin coating on a glass substrate. The film thickness was 70 nm. The laminated face of the above-described photomask two-layer metal layer was overlaid on the deposited positive photoresist film, so that the top face of the two-layer metal layer was brought into contact with the positive photoresist film. The positive photoresist film was irradiated with a femtosecond laser (center wavelength $\lambda p=800$ nm, pulse width $\tau p=100$ femtoseconds, pulse repetition rate f=82 MHz) through the photomask to obtain a photoresist pattern sample.

Figure 9B:
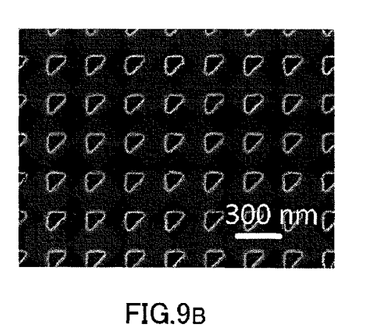
FIG. 9B illustrates a photoresist pattern patterned using the photomask.
Figure 9C:
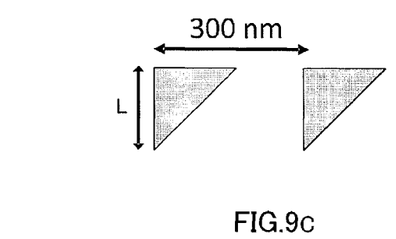
FIG. 9C illustrates the shapes of them.
Figure 10B:
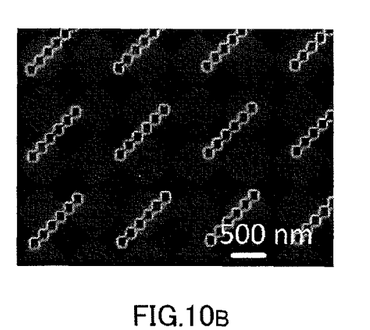
FIG. 10B illustrates a photoresist pattern patterned using the photomask.
Figure 10C:
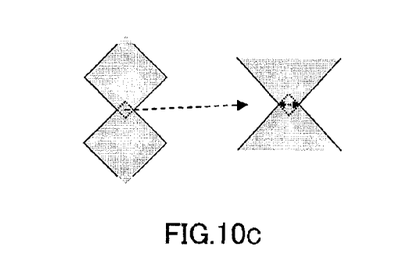
FIG. 10C illustrates the photomask pattern.

As illustrated in FIGS. 9B and 10B, it can be seen that the photomask pattern was accurately transferred onto the photoresist pattern samples obtained using the photomasks illustrated in FIGS. 9A and 10A. For example, the average of the length L of one side of the photoresist pattern illustrated in FIG. 9B was 145.1 nm, with a standard deviation of 5.5 nm. Further, the radius of curvature of the right angle vertex of the photoresist pattern was 16.6 nm, with a standard deviation of 2.8 nm.

Light Extinction Measurement

The photomask illustrated in FIG. 9A was mounted on an optical microscope (BX-51, Olympus). A parallel beam from a halogen lamp was passed through an optical filter, and the light at a wavelength from 350 to 950 nm was extracted. The light in the extracted wavelength was focused on the photomask. The light was collimated using a condenser lens in the optical microscope.

The light that had passed through the photomask was focused by an objective lens (magnification ×40, a number of aperture NA=0.5), and fed to a multi-channel light detector (PMA-11, Hamamatsu Photonics.). The obtained spectrum was normalized into an incident light spectrum. The extinction spectrum of the infrared region (800 nm to 2,000 nm) was measured with a microscope-equipped apparatus (IRT-3000) and a Fourier transform infrared spectrophotometer. The measured extinction spectrum is illustrated in FIG. 11.

Figure 11:
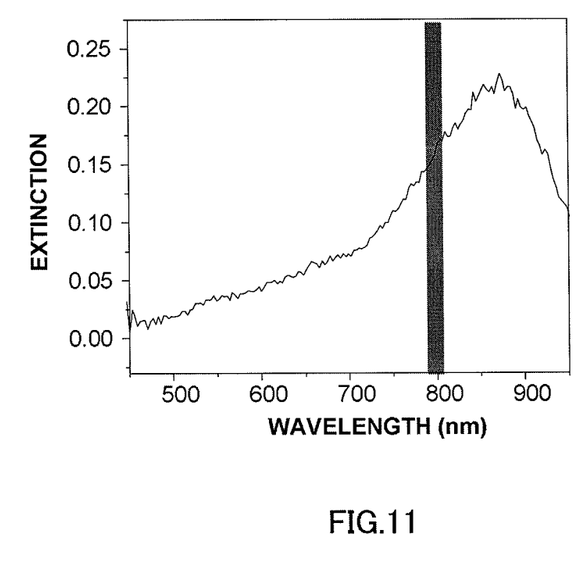
FIG. 11 illustrates an extinction spectrum of the photomask in FIG. 9A.

As illustrated in FIG. 11, it can be seen that the peak wavelength of the extinction spectrum is around 860 nm. Specifically, the peak wavelength of the plasmon resonance band of the photomask is around 860 nm. As stated above, the center wavelength of the laser light used for the resist patterning was 800 nm. Thus, it can be seen that by radiating light having a shorter wavelength than the peak wavelength of the plasmon resonance band of the photomask, multiple plasmon absorption is induced, and optical electric field enhancement is induced.

FDTD (Finite Difference Time Domain) Simulation

The electric field and the intensity thereof, generated when a femtosecond laser (center wavelength $\lambda p=800$ nm, pulse width $\tau p=100$ femtoseconds, pulse repetition rate f=82 MHz) was directed on the photomask illustrated in FIG. 9A, were profiled using a FDTD Solution software package (Lumerical, Inc). The design of the model structure used the size and shape parameters of the photomask structure illustrated in the main text. The dielectric function of gold was calculated from an experimentally-obtained optical constant (P. Johnson, R. Christy, Phys. Rev. B 1972, 6, 4730.) by fitting to the Drude model. The glass substrate and the photoresist film were defined as dielectric bodies having a constant refractive index (glass: 1.47, photoresist: 1.6). The FDTD simulation mesh size was 1 $nm^3$. The simulation results are shown in FIG. 12.

Figure 12A:
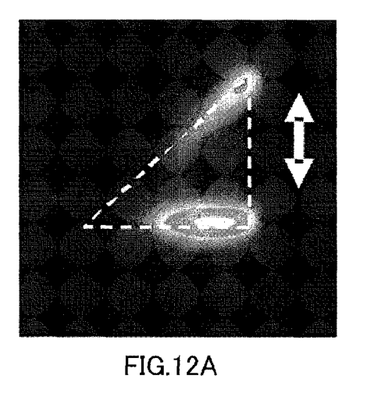
FIG. 12 illustrates the result of an FDTD (finite difference time domain) simulation of the photomask in FIG. 9A.
Figure 12B:
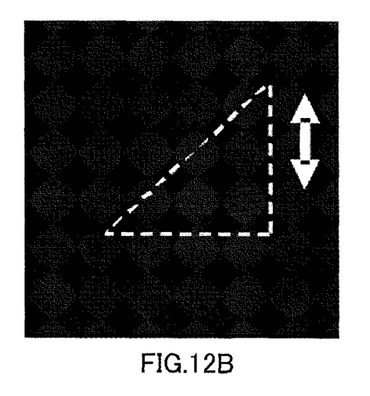
Figure 12C:
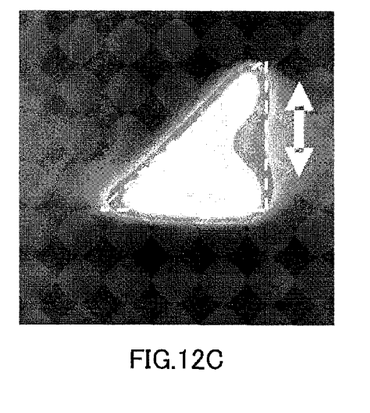
Figure 12D:
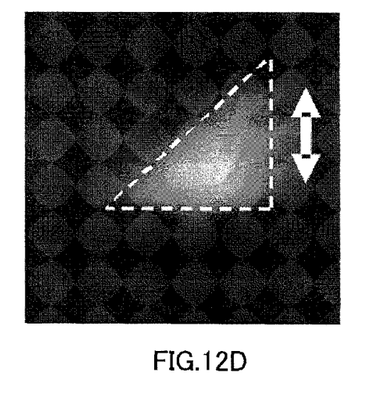

FIGS. 12A and 12B illustrate a state in which light has just reached the gold in the photomask (0 femtosecond after). FIGS. 12C and 12D illustrate a state 0.63 femtoseconds after light reached the gold in the photomask. Further, FIGS. 12A and 12C illustrate the state at the mask surface (i.e., the film surface of the resist film), and FIGS. 12B and 12D illustrate the state at the face 40 nm away from the mask surface (i.e., the face at a depth of 40 nm from the film surface of the resist film).

Focusing on after 0 femtoseconds (FIGS. 12A and 12B), in FIG. 12A (0 femtoseconds later, mask surface), near-field light was confirmed at the edges of the gold particles in the photomask. However, in FIG. 12B (0 femtoseconds, face 40 nm away from mask surface), near-field light was not confirmed.

On the other hand, focusing on at 0.63 femtoseconds (FIGS. 12C and 12D), in FIG. 12C (0.63 femtoseconds, mask surface), near-field light was confirmed at the edges of the gold particles in the photomask, and the scattering component of light based on plasmon resonance was also confirmed. Further, in FIG. 12D (0.63 femtoseconds, face 40 nm away from mask surface), although near-field light was not confirmed, the scattering component of light was confirmed.

Thus, according to the method of the present invention, it can be seen that a thick photoresist film can be reliably sensitized by propagation of the scattering component of light, and thereby precise patterning can be achieved.

Based on the above results, it is clear that the lithography technology according to the present invention is nano-photolithography technology that has a single-nanometer processing resolution, in which the distance between structures can be in a single nanometer scale and which can handle high-density pattern formation.

INDUSTRIAL APPLICABILITY

Using nano-photolithography/etching, the present invention can be applied in the production of semiconductor circuits, photonic crystals, and the like, and using nano-photolithography/lift-off, the present invention can be applied in the production of plasmonic materials, nano-gap electrodes and the like.

REFERENCE SIGNS LIST

1 Metal Nanostructure
10 Mask Substrate
20 Metal Film
50 Resist Substrate
60 Positive-type Photoresist Film
70 Gold Film
80 Near-infrared Light

The invention claimed is:

1. A method for producing a photoresist pattern comprising:

providing a photomask formed of a metal nanostructure for producing localized surface plasmon resonance, the metal nanostructure including a mask substrate having an irregular structure on a surface thereof and a metal film arranged on at least a protrusion of the irregular structure of the mask substrate;

providing a photoresist film that is sensitive to light having a wavelength X, the photoresist being formed on a surface of a resist substrate;

bringing the photomask into contact with the photoresist film; and transferring onto the photoresist film a pattern of the metal film of the photomask by generating a scattering component of light based on localized surface plasmon resonance at a surface of the metal film of the photomask by directing a light having a wavelength Y that is longer than wavelength X and 50 nm to 200 nm shorter than a peak wavelength of a plasmon resonance band of the metal nanostructure.

2. The method for producing a photoresist pattern according to claim 1, wherein the metal film is arranged on the protrusion and a recess of the irregular structure.

3. The method for producing a photoresist pattern according to claim 1, wherein a gap between metal films arranged on the mask substrate is in the range of 10 mm to 1 nm.

4. The method for producing a photoresist pattern according to claim 1, wherein the wavelength X is an ultraviolet wavelength and the wavelength Y is a near-infrared wavelength or a visible light wavelength.

5. The method for producing a photoresist pattern according to claim 1, wherein the step directing light is carried out under non-reduced pressure.

* * * * *